United States Patent [19]

Marchió et al.

[11] Patent Number: 5,350,998
[45] Date of Patent: Sep. 27, 1994

[54] STRUCTURE FOR TEMPERATURE COMPENSATING THE INVERSE SATURATION CURRENT OF BIPOLAR TRANSISTORS

[75] Inventors: Fabio Marchió, Sedriano; Enrico Novarini, Certosa Di Pavia; Giorgio Rossi, Nerviano, all of Italy

[73] Assignee: SGS-Thomson Microelectronics S.r.l., Agrate Brianza, Italy

[21] Appl. No.: 872,462

[22] Filed: Apr. 23, 1992

[30] Foreign Application Priority Data

Apr. 24, 1991 [IT] Italy .................. TO91A 000311

[51] Int. Cl.$^5$ .............................................. G05F 3/16
[52] U.S. Cl. ...................................... 323/312; 323/907; 307/296.1
[58] Field of Search ..................... 323/312, 313, 907; 307/296.1, 296.6

[56] References Cited

U.S. PATENT DOCUMENTS

| | | |
|---|---|---|
| 3,327,131 | 6/1967 | Grimmer . |
| 3,706,047 | 12/1972 | Gunzel . |
| 3,887,863 | 6/1975 | Brokaw . |
| 4,028,564 | 6/1977 | Streit et al. . |
| 4,471,236 | 9/1984 | Patterson . |

FOREIGN PATENT DOCUMENTS 0329232A 8/1989 European Pat. Off. .

*Primary Examiner*—Emanuel T. Voeltz
*Attorney, Agent, or Firm*—Townsend and Townsend Khourie and Crew

[57] ABSTRACT

A circuit for temperature compensating the inverse saturation current of a bipolar transistor having a collector region, base and emitter regions defining a base-emitter junction is disclosed. A diode element having substantially said same saturation current is parallel-connected in reverse configuration to said base-emitter junction of the bipolar transistor. If the bipolar transistor is NPN type, the diode has an anode and cathode connected respective to the emitter and base regions of the transistor.

12 Claims, 1 Drawing Sheet

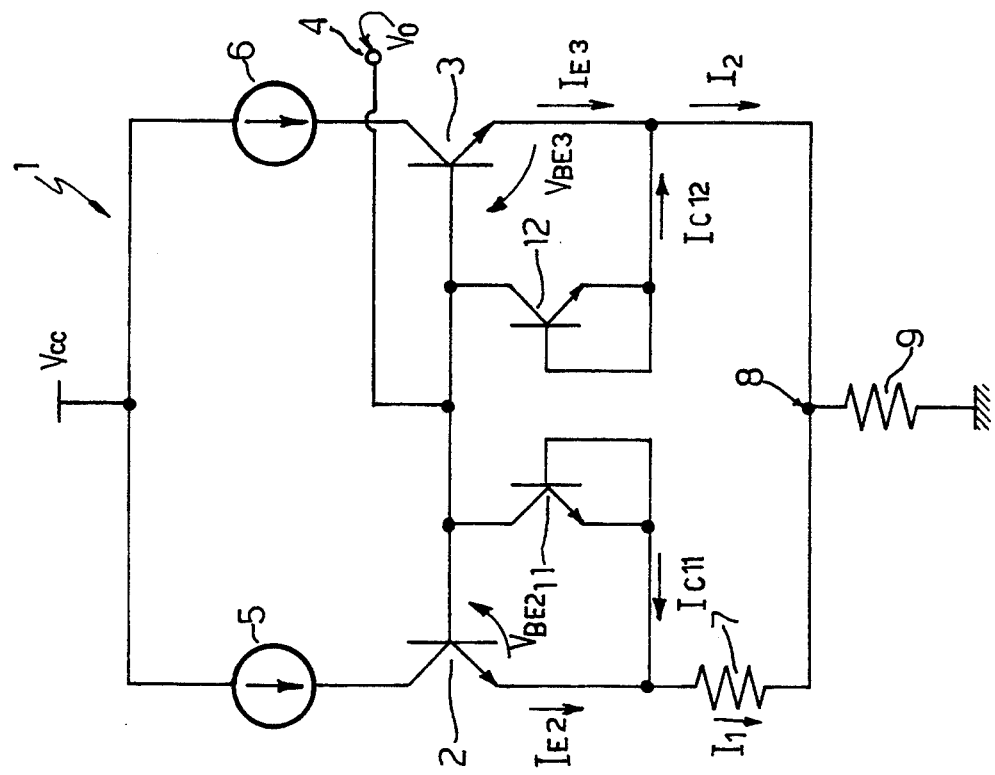
Fig. 2
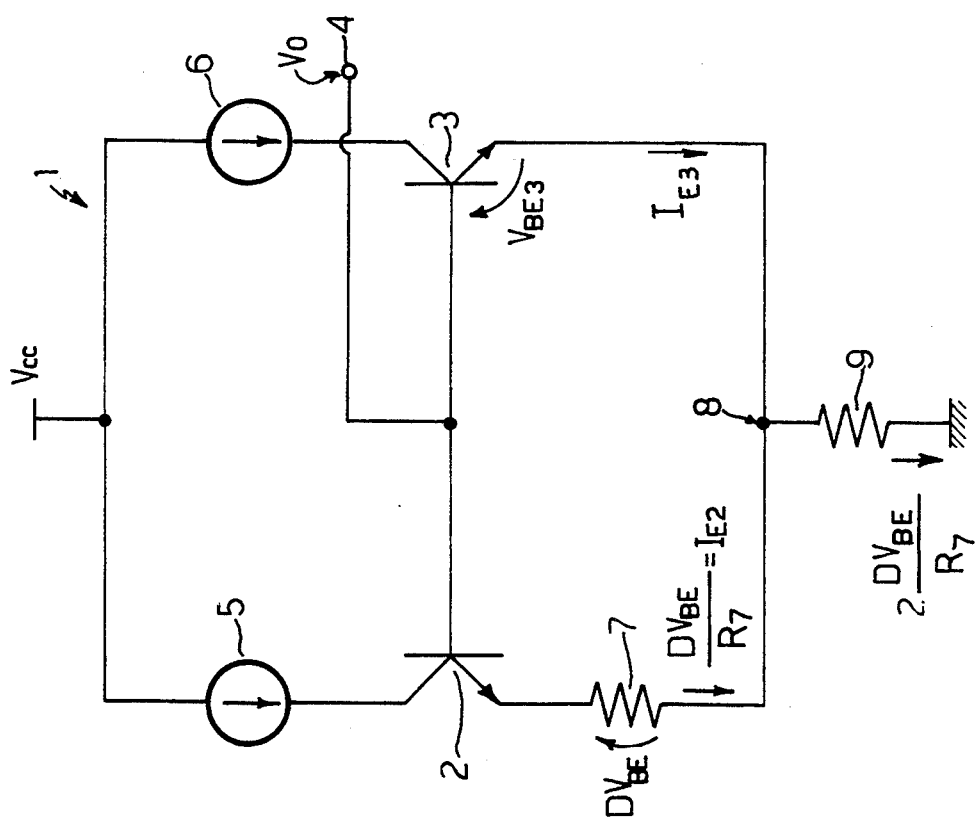
Fig. 1 - PRIOR ART 5,350,998

STRUCTURE FOR TEMPERATURE COMPENSATING THE INVERSE SATURATION CURRENT OF BIPOLAR TRANSISTORS

BACKGROUND OF THE INVENTION

The present invention relates to a structure for temperature compensating the inverse saturation current of bipolar transistors.

The emitter current $I_E$ of bipolar transistors (according to the Ebers-Moll equations; see, for example, P. R. Gray, R. G. Mayer, *Analysis and Design of Analog Integrated Circuits*, John Wiley & Sons, 1977, page 22) is the sum of two terms, one due to the voltage ($V_{BE}$) applied to the base-emitter junction of the transistor, and the other to the inverse saturation current:

$$-I_E = I_{ES}\left[\exp\left(\frac{V_{BE}}{V_T}\right) - 1\right] + \alpha_R I_{CS}\left[\exp\left(\frac{V_{BC}}{V_T}\right) - 1\right] \quad (1)$$

wherein the current entering the transistor is considered positive.

The second term in the above equation is normally negligible as compared with the first, but in the case of high temperatures and large area transistors, may become comparable with the first, in which case, it is no longer negligible. In fact (bearing in mind that $\alpha_R I_{CS} = I_S$), this gives:

$$I_S(T) = I_{Snom} \cdot \left[\frac{T}{T_{nom}}\right]^3 \cdot \exp\left[-\frac{Eg}{K}\left(\frac{1}{T} - \frac{1}{T_{nom}}\right)\right] \quad (2)$$

(I.E. Getreu, *Modeling the Bipolar Transistor*, Elsevier, page 21), where T is the temperature considered, $T_{nom}$ the nominal temperature (both in °K.), and Eg the energy gap of the semiconductor material (in eV); and $$I_{Snom} = \frac{qAD_n n_i^2}{Q_B} \quad (3)$$

(page 13 of the above text by P. R. Gray, R. G. Mayer), where A is the emitter area of the transistor, $D_n$ the electron diffusion constant, $n_i$ the concentration of intrinsic carriers in the semiconductor, and $Q_B$ the number of doping atoms in the base per area unit of the emitter.

According to equations (2) and (3), therefore, the inverse saturation current $I_{CS}$ increases alongside an increase in temperature (doubling roughly every 10° C.), and also depends on the area of the transistor. Consequently, when the temperature of the semiconductor wafer portion integrating the transistor exceeds a given temperature (around 150°–160° C.), the second term comes into effect, i.e., a reduction in the emitter current occurs.

The reduction in emitter current caused by the second term in (1) may prove troublesome in certain applications, as, for example, in the case of a voltage reference or so-called "band-gap" circuit, a typical configuration of which is shown in FIG. 1. The known circuit, numbered 1, in FIG. 1 comprises two NPN transistors 2 and 3 having a definite area ratio (in this case, the emitter area of transistor 2 is ten times that of transistor 3): having their bases connected to each other and defining the output terminal 4 of the circuit: their collectors connected to supply $V_{CC}$ (first reference potential line) via respective current sources 5, 6; and their emitters connected together and to ground (second reference potential line). In more detail, the emitter terminal of transistor 2 is connected to the emitter terminal of transistor 3 via a resistor 7, and the common point 8 is grounded via a further resistor 9.

In the circuit shown, the output voltage $V_O$ equals the base-emitter voltage drop $V_{BE1}$ of transistor 3 plus the voltage drop of resistor 9. That is, if $DV_{BE}$ is the voltage drop of resistor 7 (the difference between the base-emitter voltages of transistors 3 and 2); $R_7$ the resistance of resistor 7; $R_9$ the resistance of resistor 9: and assuming sources 5 and 6 supply the same current: this gives:

$$V_o = V_{BE3} + R_9(I_{E2} + I_{E3}) = V_{BE3} + 2DV_{BE}\left(\frac{R_9}{R_7}\right) \quad (4)$$

where $$V_{BE3} = V_T \ln\left(\frac{I_{E3}}{I_{S3}}\right)$$

$$DV_{BE} = V_T \ln\left[\left(\frac{I_{E3}}{I_{S3}}\right)\left(\frac{I_{S2}}{I_{S3}}\right)\right] \quad (5)$$

and $$V_T = \frac{KT}{q}. \quad (6)$$

As long as the second term in (1) is negligible, ($I_{E3}/I_{E2}$) remains substantially constant (these currents being set by sources 5 and 6 under normal operating conditions); ($I_{S2}/I_{S3}$) equals the area ration of the two transistors and is therefore also constant: and difference $DV_{BE}$ varies oppositely to $V_{BE3}$, thus maintaining a constant output voltage $V_o$.

Under high temperature conditions, however, ratio ($I_{E3}I_{E2}$) no longer remains constant, due to a differing variation in the voltage drops at the base-emitter junctions of transistors 2 and 3. That is, due to the larger area of transistor 2 as compared with 3, the second term in (1) first affects, or at any rate, is greater in transistor 2, so that the difference $DV_{BE}$ no longer varies oppositely to $V_{BE3}$, thus varying the output voltage $V_o$ of the circuit, which is no longer capable of supplying an accurate reference voltage at high temperature.

It is an object of the present invention to provide a structure designed to compensate inverse saturation current even at temperatures at which said inverse current becomes comparable with the first term in (1).

SUMMARY OF THE INVENTION

According to the present invention, there is provided a circuit for temperature compensating the inverse saturation current of a bipolar transistor having a collector region, base and emitter regions defining a base-emitter junction. A diode element having substantially the same saturation current is parallel-connected in reverse configuration to said base-emitter junction of the bipolar transistor. If the bipolar transistor is NPN type, the diode has an anode and cathode connected respective to the emitter and base regions of the transistor.

The present invention is highly suitable for integrated circuits so that the diode element comprises a second bipolar transistor suitably connected to form a diode element. In this context of integrated circuits, the present invention provides for a band-gap circuit which is temperature-compensated over a wide range.

BRIEF DESCRIPTION OF THE DRAWINGS

A preferred, non-limiting embodiment of the present invention will be described by way of example with reference to the accompanying drawings, in which:

FIG. 1 shows a circuit diagram of a known band-gap circuit; and

FIG. 2 shows a circuit diagram of the compensating structure according to the present invention, as applied to the FIG. 1 circuit.

DETAILED DESCRIPTION OF THE PREFERRED EMBODIMENT(S)

The FIG. 2 band-gap circuit is identical to that already described in connection with FIG. 1, and is therefore illustrated using the same numbering system.

According to the present invention, each transistor 2, 3 is provided with a second transistor 11, 12 of the same type (in this case, NPN), having the same characteristics as the associated transistor, and with its base short-circuited to the emitter. In more detail, transistor 11, having the same area as transistor 2, has its collector and emitter connected respectively to the base and emitter of transistor 2; while transistor 12, having the same area as transistor 3, has its collector and emitter connected respectively to the base and emitter of transistor 3.

As both transistors 11, 12 have their bases short-circuited to their emitters, the base-collector junctions of each transistor 11, 12 are therefore reverse-biased. That is, the transistors 11, 12 define diodes which are reverse-biased by the base-emitter voltage drop of the associated transistors 2, 3, with the cathode and anode connected respectively to the base and emitter of the associated transistor, and supplied with reverse currents (from the cathode to the anode, i.e., from the collector to the base of transistors 11, 12). Each reverse current of the diodes 11, 12 is added to the emitter current of the respective transistor 2, 3, thus compensating the second term in (1), so that the difference voltage $DV_{BE}$ continues to vary substantially oppositely to $V_{BE3}$. That is, bearing in mind the Ebers-Moll equation relative to the collector current:

$$I_C = \alpha_F I_{ES}\left[\exp\left(\frac{V_{BE}}{V_T}\right)-1\right] - I_{CS}\left[\exp\left(\frac{V_{BC}}{V_T}\right)-1\right] \quad (7)$$

and the fact that the first term is nil, due to the short-circuit between the base and emitter; that the base-collector voltage drop of transistors 11, 12 is equal (but opposite in sign) to the base-emitter voltage drop of associated transistors 2, 3; and that the saturation currents $I_{CS}$ are equal to those of the associated transistors (since the transistors being compensated and the respective compensating diodes are equal); transistors 11, 12 supply currents:

$$I_{C11} = -I_{CS2}\left[\exp\left(\frac{-V_{BE2}}{V_T}\right) - 1\right]$$

-continued $$I_{C12} = -I_{CS3}\left[\exp\left(\frac{-V_{BE3}}{V_T}\right) - 1\right]$$

which, less factor $\alpha_R$ and the difference between the base-emitter and base-collector voltage drops of each transistor 2, 3 (which, in the example shown, is nevertheless small), are substantially equal but opposite in sign to the second term in (1) for transistors 2 and 3.

Circuit 1 therefore remains constant even in the presence of extremely high temperatures (in this case, 200°–250° C.).

The advantages of the structure according to the present invention are clear from the foregoing description. In particular, by simply providing for an additional transistor having the same characteristics as the one being compensated, it is possible to substantially compensate for a temperature-induced reduction in emitter current, thus ensuring constant operation of the transistor at much higher temperatures as compared with those currently available.

Moreover, the structure according to the present invention involves no major alterations to the compensated transistor.

To those skilled in the art, it will be clear that changes may be made to the structure as described and illustrated herein without, however, departing from the scope of the present invention. In particular, it should be stressed that the structure detailed herein is in no way limited to the band-gap circuit application described above, but may be employed for any application requiring temperature compensation of the reverse saturation current of the transistor.

Moreover, instead of a transistor having a mutually short-circuited base and emitter, the compensating element may consist of a diode parallel-connected in reverse configuration, to the base-emitter junction of the compensated transistor, and having the same characteristics (i.e., a junction area equal to the area of the compensated transistor; same doping and starting material), so as to have substantially the same saturation current $I_S$.

What is claimed is:

1. A circuit for temperature compensating the reverse saturation current of a first bipolar transistor having collector, base and emitter regions defining a base-emitter junction; comprising a diode element parallel connected in reverse configuration, to said base-emitter junction of said bipolar transistor and having substantially the same saturation current.

2. A circuit as claimed in claim 1 wherein said first bipolar transistor comprises a NPN transistor and diode element has an anode region and a cathode region connected respectively to said emitter region and said base region of said bipolar transistor.

3. A circuit as claimed in claim 1 or 2, wherein said diode element comprises a second bipolar transistor of the same type as said first bipolar transistor, having the same area, and produced using the same technology as said first bipolar transistor; said second bipolar transistor having mutually short-circuited emitter and base regions.

4. A reverse saturation current-compensated bipolar transistor comprising a collector region, and base and emitter regions defining a base-emitter junction; and a diode element parallel connected in reverse configuration to said base-emitter junction, said diode element having substantially the same saturation current as said compensated transistor.

5. A compensated bipolar transistor as claimed in claim 4 wherein said bipolar transistor comprises an NPN transistor and said diode element has an anode region and a cathode region connected respectively to said emitter region and said base region of said compensated transistor.

6. A compensated bipolar transistor as claimed in claim 4 or 5, wherein said diode element comprises a second bipolar transistor of the same type as said compensated transistor, having the same area, and produced by the same process technology; said second transistor having mutually short-circuited emitter and base regions.

7. A voltage reference circuit comprising two compensated bipolar transistors, each defining a base-emitter junction, and both having mutually connected base terminals defining an output terminal of the circuit; collector terminals connected to a first reference potential via respective current sources; and emitter terminals connected together at a common point and to a second reference potential; a first resistor being series-connected to the emitter terminal of a first of said compensated transistors, and a second resistor being connected between said common point and said second reference potential; two diode elements, each parallel-connected in reverse configuration, to said base-emitter junction of a respective one of said compensated transistors, and each diode element having substantially the same saturation current as said respective compensated transistor.

8. A circuit as claimed in claim 7, wherein said compensated transistors are NPN types; and each diode element has an anode region and a cathode region connected respectively to said emitter region and said base region of said respective compensated transistor.

9. A circuit as claimed in claim 7 or 8, wherein each diode element comprises a bipolar transistor of the same type as said compensated bipolar transistors, having the same area, and produced by the same process technology as said respective compensated transistor; said bipolar transistors having mutually short-circuited emitter and base regions.

10. In a circuit having a resistive means and a first bipolar transistor having a collector region, a base region, and an emitter region, said regions connected to generate a first bipolar transistor emitter current through said resistive means, said emitter current having a reverse saturation current component, a method comprising
adding a second current through said resistive means having a magnitude substantially equal to said reverse saturation current component to compensate for temperature dependency of said reverse saturation current component.

11. A method as claimed in claim 10 wherein said first polar transistor comprises a NPN transistor and said second current adding step comprises connecting an anode region and a cathode region of a diode element respectively to said emitter region and base region of said first bipolar transistor.

12. A method as claimed in claim 11 wherein said second current adding step comprises selecting as said diode element a second bipolar transistor of the same type as first bipolar transistor, having the same area and produced using the same technology as said first bipolar transistor, said second bipolar transistor having mutually short-circuited emitter and base regions.

* * * * *